United States Patent [19]
Lien et al.

[11] Patent Number: 6,069,782
[45] Date of Patent: May 30, 2000

[54] ESD DAMAGE PROTECTION USING A CLAMP CIRCUIT

[75] Inventors: Chuen-Der Lien, Los Altos Hills; Tak Kwong Wong, Milpitas; Tzong-Kwang Yeh, Palo Alto, all of Calif.

[73] Assignee: Integrated Device Technology, Inc., Santa Clara, Calif.

[21] Appl. No.: 09/140,619

[22] Filed: Aug. 26, 1998

[51] Int. Cl.[7] .................................................. H02H 9/00
[52] U.S. Cl. .............................. 361/111; 361/56; 361/58; 361/91.1; 361/111
[58] Field of Search ........................... 361/56, 91.1, 111, 361/117, 119, 58

[56] References Cited

U.S. PATENT DOCUMENTS

| | | | |
|---|---|---|---|
| 5,301,084 | 4/1994 | Miller | 361/91 |
| 5,311,391 | 5/1994 | Dungan et al. | 361/56 |
| 5,345,356 | 9/1994 | Pianka | 361/56 |
| 5,361,185 | 11/1994 | Yu | 361/111 |
| 5,430,602 | 7/1995 | Chin et al. | 361/212 |
| 5,514,893 | 5/1996 | Miyanaga et al. | 257/360 |
| 5,541,801 | 7/1996 | Lee et al. | 361/56 |

*Primary Examiner*—Stephen W. Jackson
*Attorney, Agent, or Firm*—Skjerven Morrill MacPherson Franklin & Friel

[57] ABSTRACT

A circuit for protecting the internal circuitry of a semiconductor chip from increased power supply voltages due to electrostatic discharge events is presented. The circuit comprises a trigger circuit including a resistor and diode array coupled between a power line and a ground line and a discharge circuit which, when turned on by an output signal of the trigger circuit, conducts the excess charge on the power line to ground.

19 Claims, 4 Drawing Sheets

FIG. 3 ed up, its an an an an an an an an as  cl  cl    ##### BACKGROUND

1. Field of the Invention

This invention relates generally to electrostatic discharge (ESD) protection for integrated circuits and more specifically to a clamp circuit for the protection of an integrated circuit from increased power supply voltages caused by ESD.

2. Background

Miniaturization of device elements in semiconductor integrated circuits has caused these devices to become more susceptible to the stresses caused by electrostatic discharge (ESD). The device elements have reached the submicron level in size and, correspondingly, the MOS gate oxide films have become extremely thin. As a result, the internal circuitry of an integrated circuit is easily damaged by the electrostatic discharge stress of ESD.

Electrostatic discharge stresses are introduced to a chip in many ways during handling and manufacture of the integrated circuit. Electrostatic discharge occurs, for example, when the integrated circuit contacts with a human body or a machine which has been electrostatically charged. ESD also occurs if the integrated circuit has been electrostatically charged and the circuit comes in contact with a ground. Another ESD event can occur where the integrated circuit is placed in an electric field that is strong enough to cause discharge between the circuit and other surrounding objects.

The integrated circuit is typically surrounded by a dielectric (usually plastic) and therefore the ESD event is most likely to occur at the pads of the chip. Typically, a protection circuit is placed in the vicinity of the pads of the chip in order to prevent ESD damage to the internal circuitry. From the pads, interconnect lines give access to the internal circuitry.

During ESD events, however, the power supply voltage in the integrated circuit chip may rise sharply to very high voltage levels above ground. For example, power supply voltage increases as high as 20 V for a nominal 3.3 V power supply may occur during ESD events. This large increase in the power supply voltage may severely damage the internal circuitry of the semiconductor chip.

Conventional ESD protection circuitry is located between input pads and the ground potential, $V_{SS}$. In some cases, ESD protection circuitry includes discharge paths between the input pads and the high voltage, $V_{CC}$. However, there continues to be a need to prevent damage to the internal circuitry from the increased power supply voltage associated with electrostatic discharge.

SUMMARY OF THE INVENTION

In accordance with this invention, a circuit clamps the voltage between a high voltage, $V_{CC}$, and a ground voltage, $V_{SS}$, so that the high voltage in the chip is prevented from exceeding a particular chosen level. In some embodiments, which are applicable to integrated circuits operating at a power supply voltage of 3.3V, a clamp circuit according to the present invention prevents the power supply voltage $V_{DD}$, $V_{DD}=V_{CC}-V_{SS}$, from exceeding about 6 V.

In general, an ESD protection circuit according to the present invention includes a trigger circuit and a discharge circuit. The trigger circuit is coupled between a power line, which is held at high voltage $V_{CC}$, and a ground line, which is held at low voltage $V_{SS}$. The trigger circuit outputs a trigger signal indicating whether or not the power supply voltage $V_{DD}$, which is $V_{CC}-V_{SS}$, exceeds a cut-off voltage. The discharge circuit is coupled to the trigger circuit to receive the trigger signal and, in response to the trigger signal, conducts current between the power line and the ground line when the power supply voltage exceeds a circuit-on voltage, which may be different from the cut-off voltage.

In one embodiment of the invention, the trigger circuit includes a resistor and an array of diodes coupled in series between the power line, and the ground line. The resistor is electrically coupled to the power line and the array of diodes is electrically coupled between the resistor and the ground line. The discharge circuit includes an inverter coupled to the junction between the resistor and the array of diodes to receive a trigger voltage and presents an inverter output signal at an output terminal. The gate terminal of an n-MOS transistor is coupled to the output terminal of the inverter in order to receive the inverter output signal. The bulk terminal is coupled to the source terminal. The drain terminal of the n-MOS transistor is coupled to the power line and the source terminal is coupled to the ground line. When the transistor is turned on by the inverter output signal, a current flows between the power line and the ground line through the transistor and the power supply voltage $V_{DD}$ is pulled down (i.e., lowered) by the n-MOS transistor. When the power supply voltage $V_{DD}$ returns to an acceptable voltage level (i.e., below the circuit-on voltage), the n-MOS transistor is turned off by the inverter output signal.

In a second embodiment of the invention, the n-MOS transistor of the previously described embodiment is replaced by a p-MOS transistor. The source terminal of the p-MOS transistor is electrically coupled to the power line and the drain terminal is electrically coupled to the ground line. In addition, the resistor is electrically coupled to the ground line and the array of diodes is electrically coupled between the power line and the resistor.

The embodiments of the invention are further explained below by the drawings and subsequent discussion.

DESCRIPTION OF FIGURES

In the figures, elements having similar functions are labeled similarly.

DETAILED DESCRIPTION OF THE INVENTION

Figure 1A:
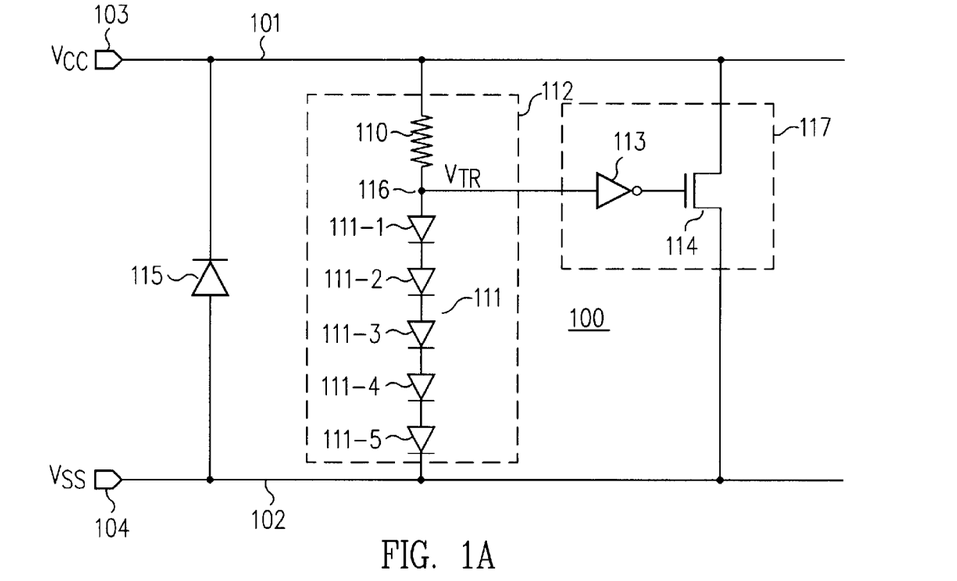
FIG. 1A shows an embodiment of an ESD protection circuit.

FIG. 1A shows one embodiment of an ESD protection circuit according to this invention. The power supply voltage, $V_{DD}$, is supplied to the integrated circuit chip between high voltage pad 103 and ground pad 104. A high voltage, $V_{CC}$, is applied to high voltage pad 103 and a ground voltage, $V_{SS}$, is applied to ground pad 104. The power supply voltage, $V_{DD}=V_{CC}-V_{SS}$, is the operating voltage of the integrated circuit chip, for example 3.3 V. Integrated circuit chips may operate at a variety of other voltages as well and this invention is applicable to an integrated circuit chip operating at any voltage.

Electrostatic discharge (ESD) protection circuit 100 is coupled between power line 101 and ground line 102. Circuit 100 includes a trigger circuit 112 and a discharge circuit 117. In general, trigger circuit 112 is coupled between power line 101 and ground line 102 and provides a trigger signal $V_{TR}$ at an output terminal 116. Discharge circuit 117 is coupled between power line 101 and ground line 102 and, in response to the trigger signal $V_{TR}$, is capable of shunting charge from power line 101 to ground line 102. In an ESD event, trigger circuit 112 alters trigger signal $V_{TR}$ when the power supply voltage exceeds a cut-off voltage, turning discharge circuit 117 on. When the power supply voltage is lowered to be less than the cut-off voltage, the trigger signal $V_{TR}$ returns to its normal setting and discharge circuit 117 is turned off.

In FIG. 1A, trigger circuit 112 includes resistor 110 and diode array 111. Resistor 110 is coupled in series with diode array 111. Diode array 111 includes diodes 111-1 through 111-5 coupled in series. One terminal of diode array 111 is coupled to ground line 102 and the other terminal is coupled to a terminal of resistor 110. The opposite terminal of resistor 110 is coupled to power line 101. The junction of diode array 111 and resistor 110 forms an output terminal 116.

Each of diodes 111-1 through 111-5 turns on when a turn-on voltage is applied to it. The trigger voltage $V_{TR}$, the voltage at output terminal 116, will be equal to high voltage $V_{cc}$ so long as the power supply voltage $V_{DD}$ is less than a cut-off voltage. The cut-off voltage is the sum of the turn-on voltages of each of the diodes 111-1 through 111-5 in diode array 111. In general, any number of diodes can be used in diode array 111 and the cut-off voltage will be the sum of the individual turn-on voltages of each of the series-connected diodes in diode array 111.

When the power supply voltage $V_{DD}$ exceeds the cutoff voltage, diode array 111 begins to conduct and the trigger voltage $V_{TR}$ is held at or near the cut-off voltage. When the high voltage $V_{CC}$ reaches a circuit-on voltage, discharge circuit 117 is turned on. Discharge circuit 117, then, shunts excess charge from power line 101 to ground line 102, thereby decreasing the high voltage $V_{CC}$. Discharge circuit 117 in FIG. 1A includes an inverter 113 and a n-MOS transistor 114.

Inverter 113 is electrically coupled to trigger circuit 112 in order to receive the trigger voltage $V_{TR}$ from output terminal 116. The output terminal of inverter 113 is electrically coupled to the gate terminal of n-MOS transistor 114. The drain terminal of transistor 114 is coupled to power line 101 while the source terminal of transistor 114 is coupled to ground line 102. The bulk terminal of transistor 114 (not shown) is coupled to the source terminal.

While the trigger voltage $V_{TR}$ is equal to high voltage $V_{cc}$, the output signal of inverter 113 will be ground voltage $V_{ss}$ and transistor 114 will be turned off (i.e., non-conducting). In an ESD event, excess charge on power line 101 causes high voltage $V_{CC}$, and therefore power supply voltage $V_{DD}$, to increase. When the power supply voltage $V_{DD}$ exceeds the circuit-on voltage, the circuit-on voltage being the high voltage $V_{CC}$ required to cause inverter 113 to change output states, the output signal of inverter 113 becomes the high voltage $V_{cc}$. Transistor 114 turns on when the output signal from inverter 113 exceeds the gate-source threshold voltage of transistor 114.

Turning transistor 114 on nearly shorts power line 101 to ground line 102. The power supply voltage $V_{DD}$ is dragged down by the resulting current flow between power line 101 and ground line 102 and the excessive charge on power line 101 due to the ESD event is directed to ground line 102. As the power supply voltage $V_{DD}$ drops, circuit 100 begins to return to its normal, nonconducting state.

Transistor 114 shuts off when the output signal of inverter 113 becomes less than the gate-source threshold voltage of transistor 114. When transistor 114 shuts off, no current flows between power line 101 and ground line 102 through transistor 114. Current may still flow through inverter 113 and through diode array 111 until the power supply voltage $V_{DD}$ drops below the cut-off voltage of diode array 111.

When the power supply voltage $V_{DD}$ drops below the circuit-on voltage, the inverter output signal returns to ground voltage $V_{ss}$. When the power supply voltage $V_{DD}$ drops below the cut-off voltage, diodes 111-1 through 111-5 stop conducting and the trigger voltage $V_{TR}$ once again becomes high voltage $V_{cc}$ and ESD protection circuit 100 returns to its normal state. The excess charge on power line 101 due to electrostatic discharge has been directed to ground line 102 through circuit 100.

In addition to preventing large positive swings of the power supply voltage $V_{DD}$, ESD protection circuit 100 also includes parasitic diode 115, which prevents large negative swings of the power supply voltage $V_{DD}$. Parasitic diode 115 conducts when $V_{ss}-V_{cc}$ exceeds the turn-on voltage of diode 115. Therefore, high voltage $V_{cc}$ is brought back to ground $V_{ss}$ minus the turn-on voltage of diode P.

Figure 1B:
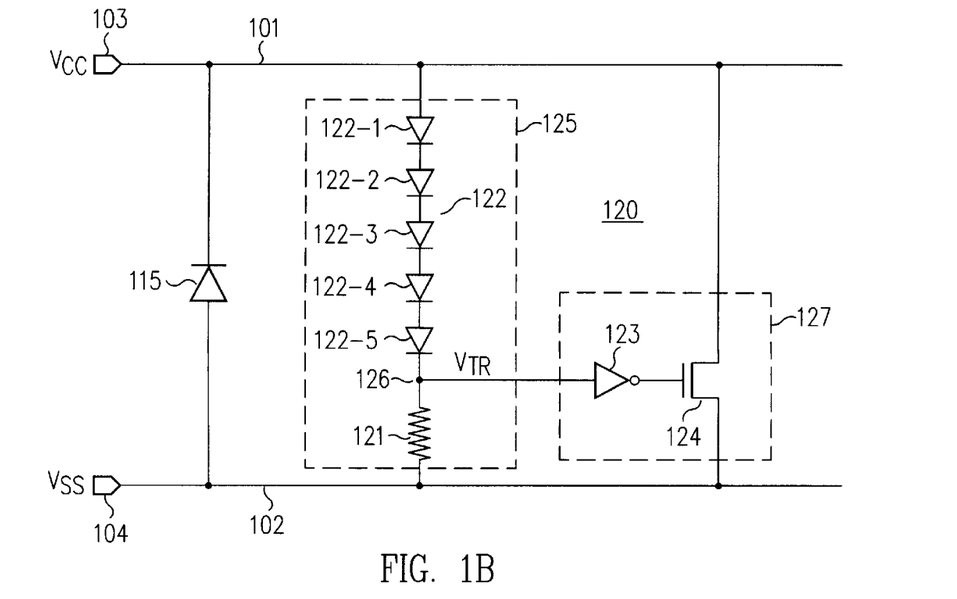
FIG. 1B shows a second embodiment of an ESD protection circuit.

FIG. 1B shows a second embodiment of the invention. ESD protection circuit 120 includes a trigger circuit 125 and a discharge circuit 127. Trigger circuit 125 is coupled between power line 101 and ground line 102 and provides a trigger voltage $V_{TR}$. Discharge circuit 127 is coupled to trigger circuit 125 to receive trigger voltage $V_{TR}$. Discharge circuit 127 is also coupled between power line 101 and ground line 102 and, in response to trigger voltage $V_{TR}$, conducts current between power line 101 and ground line 102 in an ESD event.

In FIG. 1B, discharge circuit 127 includes p-MOS transistor 124 rather than n-MOS transistor 114 of FIG. 1A. Trigger circuit 125 is formed by resistor 121 and diode array 122. Diode array 122 includes diodes 122-1 through 122-5 coupled in series. One terminal of diode array 122 is coupled to power line 101 and the other terminal is coupled to a terminal of resistor 121. The opposite terminal of resistor 121 is coupled to ground line 102. The junction between diode array 122 and resistor 121 forms output terminal 126.

The trigger voltage $V_{TR}$, provided at output terminal 126, is equal to ground voltage $V_{ss}$ until the power supply voltage $V_{DD}$ reaches the cut-off voltage determined by the sum of the turn-on voltages of diodes 122-1 through 122-5. When the power supply voltage $V_{DD}$ exceeds the cut-off voltage, the voltage difference $V_{cc}-V_{TR}$ is held at a voltage nearly equal to the cut-off voltage.

Discharge circuit 127 includes inverter 123 and p-MOS transistor 124. Inverter 123 is coupled to output terminal 126 of trigger circuit 125 to input the trigger voltage $V_{TR}$. The output terminal of inverter 123 is coupled to the gate terminal of transistor 124. The source terminal of transistor 124 is coupled to power line 101 and the drain terminal of transistor 124 is coupled to ground line 102.

The output signal from inverter 123 is normally at high voltage $V_{cc}$ because the trigger voltage $V_{TR}$ is normally ground $V_{ss}$. However, when the power supply voltage $V_{DD}$ increases, as for example with an ESD event, and exceeds a circuit-on voltage, at which point inverter threshold voltage equals $V_{CC}-V_{TR}$, the inverter output voltage becomes ground voltage $V_{ss}$. Transistor 124 turns on when the high voltage $V_{CC}$ minus the inverter output voltage exceeds the gate-source threshold voltage of transistor 124. Current then flows between power line 101 and ground line 102, draining the excessive charge from power line 101 to ground.

As the power supply voltage $V_{DD}$ is lowered by the current flow through circuit 120, the inverter output voltage again becomes high voltage $V_{cc}$ and, finally, when the power supply voltage $V_{DD}$ drops below the cut-off voltage, the diode array 122 shuts off and circuit 120 returns to its normal state.

One of ordinary skill in the art can devise obvious modification of the circuits shown in FIGS. 1A and 1B. One modification is to increase or decrease the number of diodes in the diode array in order to alter the cut-off voltage. Another modification is to change the characteristics of the diodes so that diode array 111 or 121 (FIGS. 1A or 1B, respectively) starts conducting at a different cut-off voltage. A modification implemented in some embodiments of the invention includes adding a capacitor between output terminal 116 or 125 and power line 101 so that the trigger voltage $V_{TR}$ ramps to high voltage $V_{cc}$ on chip start up, preventing large current surges when the chip is powered up.

Figure 2A:
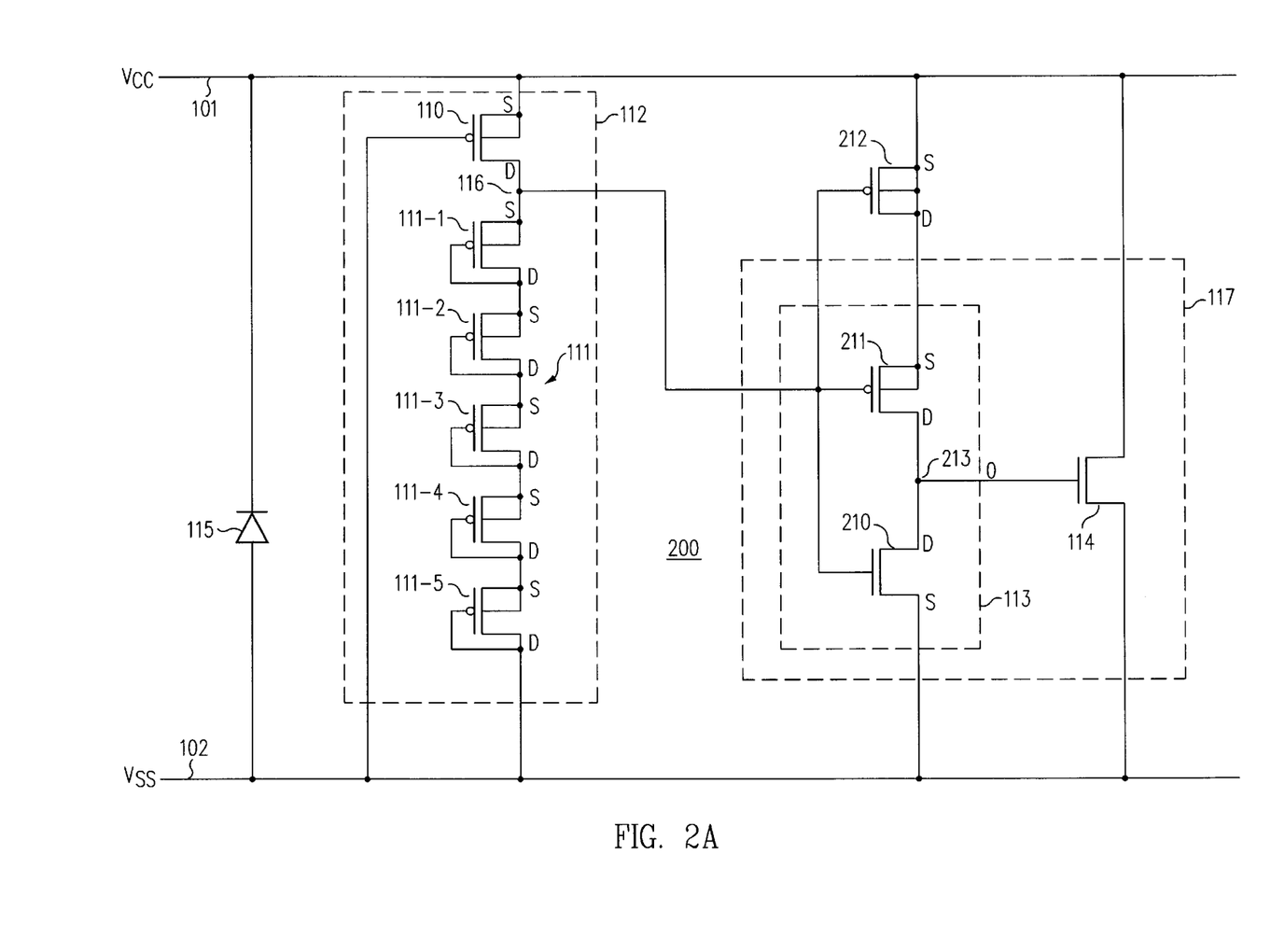
FIG. 2A shows a MOSFET implementation of the ESD protection circuit shown in FIG. 1A.
Figure 2B:
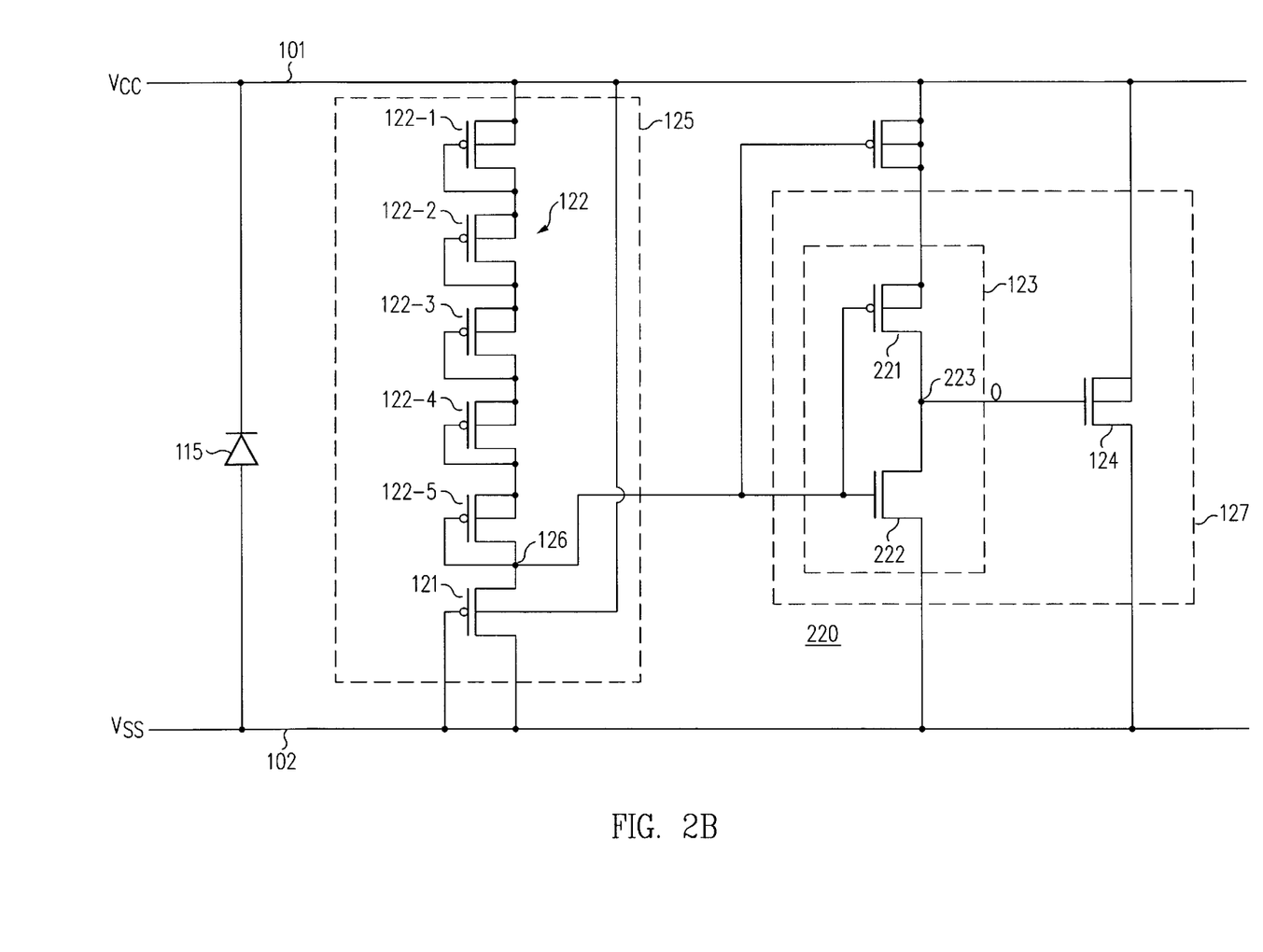
FIG. 2B shows a MOSFET implementation of the ESD protection circuit shown in FIG. 1B.

FIG. 2A shows an implementation of circuit 100 of FIG. 1A that is suitable for production on an integrated circuit chip. A similar circuit which implements circuit 120 of FIG. 1B is shown in FIG. 2B.

In FIG. 2A, EDS protection circuit 200 includes trigger circuit 112 and discharge circuit 117. Trigger circuit 112 includes transistor 110 and transistors 111-1 through 111-5. The p-MOS transistor 110, configured as a resistor, has a gate terminal electrically coupled to ground line 102 and a bulk terminal and source terminal coupled to power line 101. In this configuration, transistor 110 acts as a resistor with one terminal coupled to power line 101. Transistors 111-1 through 111-5 are p-MOS transistors configured as diodes. In the diode configuration of a p-MOS transistor, the bulk terminal is coupled to the source terminal and the gate terminal is coupled to the drain terminal. Trigger circuit 112 is coupled in the following manner: The source terminal of transistor 110 is coupled to power line 101; the source terminal of transistor 111-1 is coupled to the drain terminal of transistor 110; the drain terminals of each of transistors 111-1 through 111-4 are coupled to the source terminals of each of transistors 111-2 through 111-5, respectively; and the drain terminal of transistor 111-5 is coupled to ground line 102.

So long as the power supply voltage $V_{DD}$ remains less than a cut off value determined by diode array 111, formed by transistors 111-1 through 111-5, then transistors 111-1 through 111-5 remain off. With no current flow through transistor 110, the trigger voltage $V_{TR}$ is equal to the high voltage $V_{cc}$. When the power supply voltage $V_{DD}$ exceeds the cut-off voltage, current flows through trigger circuit 112, holding the trigger voltage $V_{TR}$ at or near the cut-off voltage.

Discharge circuit 117 includes inverter 113 and n-MOS transistor 114. Inverter 113 includes p-MOS transistor 211 and n-MOS transistor 212. The source terminal and bulk terminal of transistor 211 are coupled to power line 101. The drain terminal of transistor 211 is coupled to the drain terminal of transistor 210 and forms the inverter output terminal 213. The source terminal of transistor 210 is coupled to ground line 102. The gate terminals of both transistors 211 and 210 are coupled to output terminal 116 of trigger circuit 112 to receive the trigger voltage $V_{TR}$.

In inverter 113 of FIG. 2A, transistor 210 is normally on because the trigger voltage $V_{TR}$ is normally equal to the high voltage $V_{cc}$. With high voltage $V_{cc}$ and the trigger voltage $V_{TR}$ equal, transistor 211 is normally off. With transistor 210 on and transistor 211 off, the inverter output voltage of inverter 113, present at the inverter output terminal 213, is ground voltage $V_{ss}$.

Transistor 211 turns on when the voltage difference between power supply voltage $V_{cc}$ and the trigger voltage $V_{TR}$ exceeds the gate-source threshold voltage of transistor 211. The circuit-on voltage, therefore, is higher than the power supply voltage $V_{DD}$ required to turn transistor 211 on. As transistor 211 begins to turn on, current flows through the inverter from power line 101 to ground line 102 and the inverter output voltage on terminal 213 increases. Transistors 210 and 211 in FIG. 2A are such that when both transistors 210 and 211 are on, the output signal of inverter 113 is nearly the high voltage $V_{cc}$.

The inverter output terminal 213 is coupled to the gate terminal of transistor 114. Transistor 114 is turned on when the inverter output voltage exceeds the gate-source threshold voltage of transistor 114. When transistor 114 is turned on, current flows from power line 101 to ground line 102 through transistor 114.

As current flows from power line 101 to ground line 102, the power supply voltage $V_{DD}$ drops and transistor 114 is shut off when the inverter output signal drops below the gate-source threshold voltage of transistor 114. Transistor 211 is shut off when $V_{cc}-V_{TR}$ drops below the gate-source threshold of transistor 211. Finally, the diode array 111 in trigger circuit 112 shuts off when the power supply voltage $V_{DD}$ drops below the cut-off voltage. EDS protection circuit 200 then returns to its normal state.

Transistor 212 in FIG. 2A is a p-MOS transistor configured as a capacitor. As a capacitor, the bulk terminal, source terminal and drain terminal are coupled together to form one capacitor terminal. The capacitor terminal formed by the bulk terminal, source terminal and drain terminal of transistor 212 is coupled to power line 101 and the gate terminal of transistor 212 is coupled to output terminal 116. The trigger voltage $V_{TR}$ is then ramped up to power supply voltage $V_{cc}$ on chip start-up, preventing excessive current flow upon powering the chip.

In summary, when the power supply voltage $V_{DD}$ exceeds a particular voltage, indicating an ESD event, diode array 111 turns on and current flows through trigger circuit 112 so that the trigger voltage $V_{TR}$ is held at or near the cut-off voltage. When the power supply voltage $V_{DD}$ continues to increase and $V_{cc}-V_{TR}$ exceeds the gate-source threshold voltage of transistor 211, transistor 211 turns on and current flows between power line 101 and ground line 102 through inverter 113. Finally, when 211 turns on, transistor 114 is turned on and current flows between power line 101 and ground line 102 through transistor 114.

As the power supply voltage $V_{DD}$ returns to normal levels because of the current drain, transistor 114, transistor 211 and the diode array 111 are sequentially shut off, returning circuit 200 to its normal state.

Although circuit 200 only conducts on positive voltage swings of the power supply voltage $V_{DD}$, large negative voltage swings of the power supply voltage $V_{DD}$ are prevented by parasitic diode 115, which is coupled between power line 101 and ground line 102. The parasitic diode 115 turns on when $V_{ss}$ exceeds $V_{cc}$ by the turn on voltage of diode 115, dragging $V_{cc}$ back up.

EDS protection circuit 220 shown in FIG. 2B implements circuit 120 shown in FIG. 1B. Circuit 200 includes trigger circuit 125 and discharge circuit 127. Circuit 220 shown in FIG. 2B differs from circuit 200 of FIG. 2A primarily by use of a p-MOS transistor in discharge circuit 127 as opposed to a n-MOS transistor in discharge circuit 117.

Trigger circuit 125 in FIG. 2B includes diode array 122 and transistor 121. Transistor 121 is an n-MOS transistor configured as a resistor, i.e., the gate terminal is coupled with power line 101 and the bulk terminal is coupled with ground line 102. Diode array 122 is formed by n-MOS transistors 122-1 through 122-5, each of which being configured as diodes (i.e., with the gate terminal coupled to the drain terminal and the bulk terminal coupled with the source terminal). In diode array 122, the source terminals of diodes 122-1 through 122-4 are coupled to the drain terminals of 122-2 through 122-5, respectively. In trigger circuit 125, the drain terminal of transistor 122-1 is coupled with power line 101; the source terminal of transistor 122-5 is coupled with the drain terminal of transistor 121; and the source terminal of transistor 121 is coupled with ground line 102. The junction between diode array 122 and transistor 121 forms output terminal 126. Transistor 225 is an n-MOS transistor configured as a capacitor coupled between output terminal 126 and ground line 102.

The trigger voltage $V_{TR}$, i.e., the voltage at output terminal 126, is normally ground voltage $V_{ss}$. When the power supply voltage $V_{DD}$ exceeds the cut-off voltage determined by diode array 122, the trigger voltage $V_{TR}$ increases such that $(V_{cc}-V_{TR})$ is held at or near the cut-off voltage.

Discharge circuit 127 includes inverter 123 and transistor 124. Inverter 123 includes p-MOS transistor 221 and n-MOS transistor 222. The source terminal and drain terminal of transistor 221 are coupled with power line 101. The drain terminal of transistor 221 is coupled with the drain terminal of transistor 222. Output terminal 223 is formed at the junction between transistor 221 and transistor 222. The source terminal of transistor 222 is coupled with ground line 102. The gate terminals of transistors 221 and 222 are coupled with output terminal 126 of trigger circuit 125.

During normal operation, transistor 222 is off and transistor 221 is on. Therefore, the inverter output voltage on output terminal 223 is normally $V_{cc}$. Transistor 222 turns on when the power supply voltage $V_{DD}$ increased such that $V_{TR}-V_{ss}$ exceeds the gate-source threshold voltage of transistor 222. The inverter output voltage decreases when transistor 222 begins to turn on. The inverter transistors 221 and 222 in FIG. 2B are such that when both 221 and 222 are on, the output voltage of the inverter is nearly ground $V_{ss}$.

Transistor 124 turns on when the voltage difference between high voltage $V_{cc}$ and the inverter output voltage exceeds the gate-source threshold of transistor 124. When transistor 124 turns on, current flows between power line 101 and ground line 102 through transistor 124.

When the power supply voltage $V_{DD}$ returns to acceptable levels because of the current drain, transistor 124, transistor 222, and the diode array 122 are turned off. ESD protection circuit 220, then, returns to normal operation, the excess charge on the power supply due to an electrostatic discharge having been shunted to ground.

Figure 3:
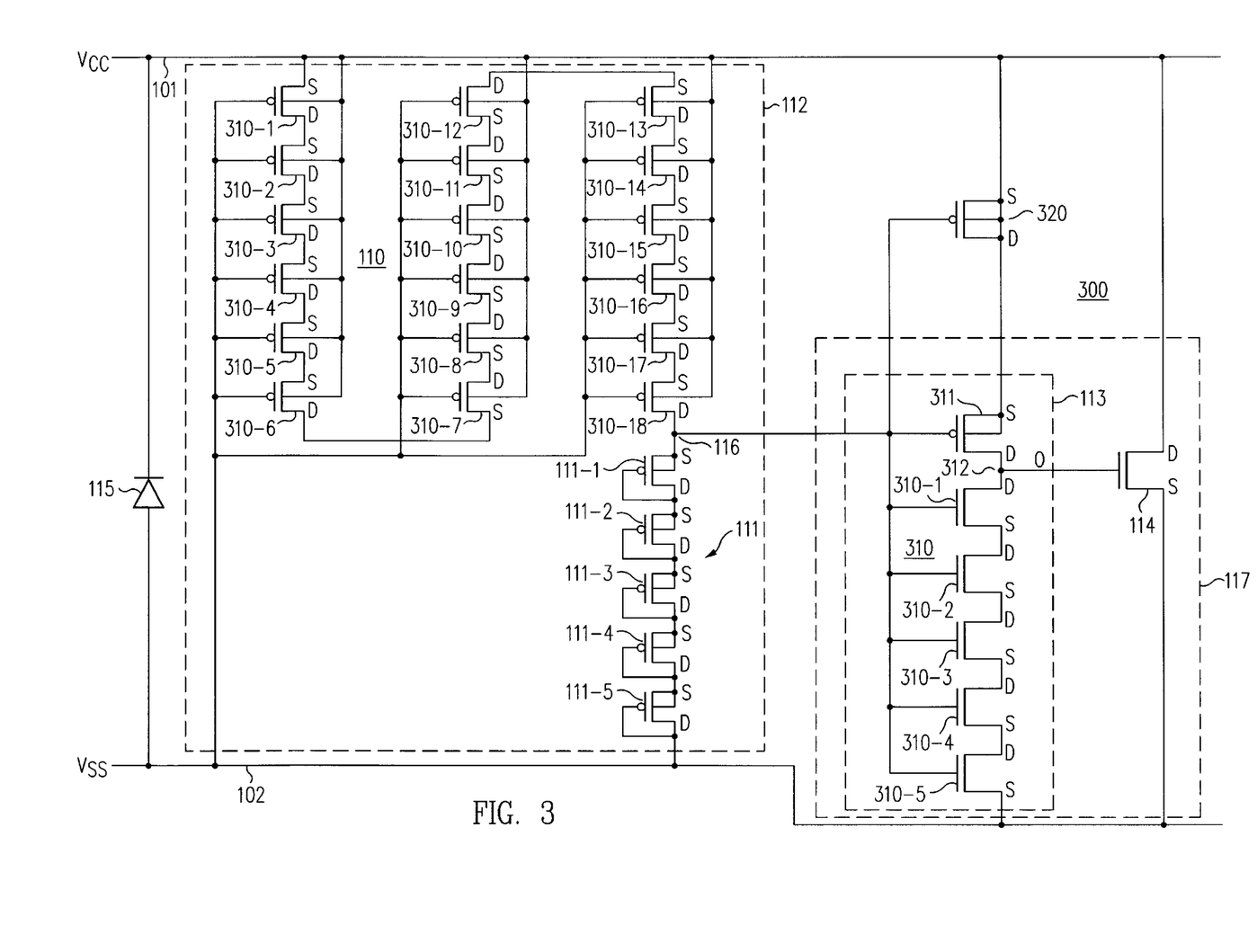
FIG. 3 shows a an embodiment of the ESD protection circuit shown in FIG. 1A.

Another embodiment of the invention is shown in FIG. 3. FIG. 3 shows an implementation of the embodiment shown in FIG. 1A. A similar implementation of FIG. 1B is not shown but is obvious to one having ordinary skill in the art in view of this disclosure.

EDS protection circuit 300 includes a trigger circuit 112 and a discharge circuit 117. Trigger circuit 112 includes resistor array 310 and diode array 111. Resistor array 310 includes p-MOS transistors 310-1 through 310-18, each of which are configured as resistors. Diode array 111 includes p-MOS transistors 111-1 through 111-5. In the resistor configuration, the gate terminals of transistors 310-1 through 310-18 are coupled to ground line 102 and the bulk terminals of transistors 310-1 through 310-18 are coupled to power line 101. The source terminal of transistor 310-1 is coupled to the power line 101 and the drain terminals of transistors 310-1 through 310-17 are coupled to the source terminals of transistors 310-2 through 310-18, respectively. In one exemplary embodiment, each of p-MOS transistors 310-1 through 310-18 has a channel length of about 0.7 $\mu$m and a channel width of about 1.5 $\mu$m. However, other transistors can be used.

Transistors 111-1 through 111-5 are configured as diodes: For each transistor, the gate terminal is coupled to the drain terminal and the bulk terminal is coupled to the source terminal. The source terminal of transistor 111-1 is coupled to the drain terminal of transistor 310-18. The drain terminals of transistors 111-1 through 111-4 are coupled to the source terminals of transistors 111-2 through 111-5, respectively. The drain terminal of transistor 111-5 is coupled to ground line 102. The trigger voltage $V_{TR}$ is taken from an output terminal 116 at the junction between resistor array 310 and diode array 111 (i.e., the source terminal of transistor 111-1). In the exemplary embodiment, p-MOS transistors 111-1 through 111-5 each have a channel length of about 0.7 $\mu$m and a channel width of about 30 $\mu$m. However, other transistors can also be used.

When the power supply voltage $V_{DD}$ reaches the cut-off voltage of diode array 111, diode array 111 turns on and conducts current so that the trigger voltage $V_{TR}$ at output terminal 116 is held at nearly the cut-off voltage. The cut-off voltage is the sum of the turn-on voltages of each of the individual transistors in diode array 111. In FIG. 3, the cut-off voltage is five times the turn-on voltages of transistor 111-1 because each of the five transistors 111-1 through 111-5 are the same.

In the exemplary embodiment, diode array 111 begins to conduct when the power supply voltage $V_{DD}$ reaches a cut-off voltage of about 4.8 V. If the power supply voltage $V_{DD}$ is further increased, the trigger voltage $V_{TR}$ is held near to the cut-off voltage. However, as the power supply voltage $V_{DD}$ increases, the trigger voltage $V_{TR}$ will also increase. For example, in the exemplary embodiment, as the power supply voltage increases from 5.7 V to 10 V, the trigger voltage increases from about 4.8 V to about 5.7 V. These values may be altered by modifying the number of transistors in diode array 111.

Discharge circuit 117 includes inverter 113 and n-MOS diode 114. Inverter 113 includes p-MOS transistor 311 and transistor array 310. Transistor array 310 includes n-MOS transistors 310-1 through 310-5. In each of transistors 311 and 310-1 through 310-5, the bulk terminal is coupled to the source terminal.

The source terminals of transistors 310-1 through 310-4 are coupled to the drain terminals of transistors 310-2 through 310-5, respectively. The source terminal of transistor 310-5 is coupled to ground line 102. The drain terminal of transistor 310-1 is coupled to the drain terminal of transistor 311, this junction forming an output terminal 312 for inverter 113. The source terminal of transistor 311 is coupled to power line 101. The gate terminals of transistors 311 and 310-1 through 310-5 are coupled to the output terminal of trigger circuit 112 to receive the trigger voltage $V_{TR}$.

In the exemplary embodiment, p-MOS transistor 311 has channel width of about 25 μm and a channel length of about 0.6 μm. In addition, n-MOS transistors 310-1 through 310-5 have channel widths of about 1.5 μm and channel lengths of about 1 μm. Transistor 311, therefore, is physically much larger than any of transistors 310-1 through 310-5 and, when turned on, dominates transistors 310-1 through 310-5.

The inverter output voltage, present at inverter output terminal 312, is normally ground voltage $V_{ss}$ because the trigger voltage $V_{TR}$ is normally equal to the high voltage $V_{cc}$. Transistors 310-1 through 310-5, therefore, are normally on, holding the inverter output signal at output terminal 312 at ground voltage $V_{SS}$. As the power supply voltage $V_{DD}$ increases above the cut-off voltage, diode array 111 turns on and the trigger voltage $V_{TR}$ is held at or near the cut-off voltage. Increases in power supply voltage $V_{DD}$ to levels above the circuit-on voltage result in transistor 311 of inverter 113 turning on. Transistor 311 begins to turn on when $V_{CC}-V_{TR}$ is about 0.6 V. As a result of the relative sizes of transistors 311 and transistors 310-1 through 310-5, when transistor 311 is on the inverter output signal becomes nearly the high voltage $V_{cc}$. For example, the difference between the high voltage $V_{CC}$ and inverter output voltage is about 0.2 V when $V_{CC}-V_{TR}$ is about 1.5 V.

The inverter output terminal 312 is coupled to the gate terminal of n-MOS transistor 114. The drain terminal of transistor 114 is coupled to power line 101 and the source terminal is coupled to ground line 102. The bulk terminal of transistor 114 is coupled to the source terminal of transistor 114. When the inverter output voltage increases above the gate-source threshold of transistor 114, transistor 114 turns on and current flows from power line 101 to ground line 102, thereby reducing the power supply voltage $V_{DD}$. As the power supply voltage $V_{DD}$ decreases, transistor 114, transistor 311 and the diode array 111 are shut off, returning circuit 300 to its normal state. In the exemplary embodiment, the channel width of transistor 114 is 540 μm and the channel length is 0.75 μm.

Finally, transistor 320 in FIG. 3A is configured as a capacitor coupled between output terminal 116 of trigger circuit 112 and power line 101. In the exemplary embodiment, transistor 320 has a channel width of about 15 μm and a channel length of about 1.5 μm.

In the exemplary embodiment, trigger circuit 112 begins to conduct when the power supply voltage $V_{DD}$ exceeds about 4.8 V. When the power supply voltage $V_{DD}$ exceeds the circuit-on voltage of about 5.7 V, transistor 311 of inverter 113 begins to turn on. The output signal of inverter 113 becomes nearly $V_{cc}$, turning transistor 114 on. When the power supply voltage $V_{DD}$ is about 6.8 V, for example, the output signal of inverter 113 becomes about 6.4 V. Excess charge on power line 101 is directed to ground line 102 through transistor 114 until the power supply voltage $V_{DD}$ drops below about 5.7 V, shutting off both transistor 311 and transistor 114. Circuit 300 returns to normal when the power supply voltage $V_{DD}$ once again drops below about 4.8 V.

Large negative swings in the power supply voltage $V_{DD}$ are prevented by parasitic diodes represented in FIG. 3 by diode 115. Diode 115 will prevent $V_{cc}$ from becoming lower than $V_{ss}$ minus the turn-on voltage of parasitic diode 115.

Transistor 114 needs to be large enough to shunt the excess electrostatic charge associated with the ESD event to ground. In general, resistor array 110, diode array 111, and transistor array 310 can include any number of individual transistor devices. In addition, the channel lengths and channel widths for individual transistors indicated here are exemplary only and are not to be construed as limiting. Any combination of transistors configured such that transistor 311 dominates transistor array 310 can be utilized.

The cut-off voltage is selected to be high enough so that normal variations in the power supply voltage $V_{DD}$ do not intermittently trigger the circuit and result in current flow through circuit 300. In the exemplary embodiment, circuit 320 prevents the power supply voltage $V_{DD}$ from exceeding about 6 V and is useful to protect integrated circuits operating at a voltage of 3.3 V. If the circuit conducts on power supply voltages less than 6 V, intermittent shorts of the power supply may result. If the circuit does not conduct on voltages greater than 6 V, it likely does not yield the desired protection of the internal circuitry of the chip.

Several modifications of the circuit shown in FIG. 3 will be obvious to one skilled in the art. For example, instead of relying on the parasitic diode 115 to prevent negative swings in power supply voltage $V_{DD}$, a p-MOS transistor configured as a diode can be coupled between power line 101 and ground line 102. In addition, the number of transistors in resistor array 110 can be modified. The number of transistors in the diode array 111 can be modified. Also, the number of transistors in the inverter circuit can be modified. In addition, FIG. 3 may be modified to implement the ESD protection circuit described in FIGS. 1B and 2B instead of that described in FIG. 1A and 2A.

The examples illustrated here are representative examples and in no way limit the scope of this application. Other obvious embodiments of the invention will be apparent to one of ordinary skill in the art and are included within the scope of this invention. One such embodiment, for example, would be to substitute a p-MOS transistor for transistor 114 of FIG. 1A where the gate terminal of transistor 114 is coupled to output terminal 116 of trigger circuit 112 without the presence of inverter 113. A similar modification of the ESD protection circuit shown in FIG. 1B could be made. The scope of this invention is limited only by the following claims.

We claim:

1. An electrostatic discharge (ESD) protection circuit, comprising:
   a trigger circuit coupled between a power line and a ground line to detect a power supply voltage, the trigger circuit generating a trigger signal when the power supply voltage exceeds a cut-off voltage; and
   a discharge circuit coupled to the trigger circuit to receive the trigger signal, the discharge circuit conducting current between the power line and the ground line in response to the trigger signal.

2. The circuit of claim 1, wherein the discharge circuit comprises a transistor.

3. The circuit of claim 2, wherein the discharge circuit further includes an inverter coupled between the trigger circuit and the transistor.

4. The circuit of claim 3, wherein the transistor is a n-MOS transistor.

5. The circuit of claim 3, wherein the transistor is a p-MOS transistor.

6. The circuit of claim 4, wherein the trigger circuit comprises:
   a resistor having a first terminal and a second terminal, the first terminal being coupled to the power line;
   at least one diode coupled in series to form a diode array, the diode array having a first terminal and a second terminal, the first terminal being coupled to the second terminal of the resistor and forming a trigger output terminal for presenting the trigger signal, the second terminal of the diode array being coupled to the ground line; and wherein the diode array turns on and conducts current when the power supply voltage exceeds the cut-off voltage.

7. A circuit as in claim 5, wherein the trigger circuit comprises:

a resistor having a first terminal and a second terminal, the second terminal being coupled to the ground line;

at least one diode coupled in series to form a diode array, the diode array having a first terminal and a second terminal, the first terminal being coupled to the power line, and the second terminal being coupled to the first terminal of the resistor and forming an output terminal for presenting the trigger signal; and wherein the diode array turns on and conducts current when the power supply voltage exceeds the cut-off voltage.

8. A circuit as in claim 3, wherein the inverter comprises:

a p-MOS transistor having a gate terminal, a bulk terminal, a source terminal and a drain terminal, the bulk terminal and the source terminal being coupled to the power line, and the gate terminal being coupled to the trigger circuit to receive the trigger signal; and a n-MOS transistor having a gate terminal, a drain terminal and a source terminal, the source terminal being coupled to the ground line, the drain terminal being coupled to the drain terminal of the p-MOS transistor, and the gate terminal being coupled to the gate terminal of the p-MOS transistor.

9. A circuit as in claim 8, wherein the n-MOS transistor of the inverter comprises a plurality of n-MOS transistors, each of the plurality of n-MOS transistors having a gate terminal, a drain terminal, and a source terminal, the gate terminal of each of the plurality of n-MOS transistors being coupled so as to form the gate of the n-MOS transistor, the plurality of n-MOS transistors being coupled in series by the drain terminal and the source terminal of each of the plurality of n-MOS transistors to form the n-MOS transistor.

10. A circuit as in claim 6, wherein the resistor comprises a plurality of p-MOS transistors, each of the plurality of p-MOS transistors having a gate terminal, a bulk terminal, a source terminal and a drain terminal, the gate terminal of each of the plurality of p-MOS transistors being coupled to the ground line, the bulk terminal of each of the plurality of p-MOS transistors being coupled to the power line, and the plurality of p-MOS transistors being coupled in series by the drain terminal and the source terminal of each of the plurality of p-MOS transistors.

11. A circuit as in claim 1, wherein the cut-off voltage is between 5.5 V and 6.5 V.

12. A circuit as in claim 1, wherein the cut-off voltage is between 3.6 V and 5.5 V.

13. A circuit as in claim 1, wherein the cut-off voltage is greater than 6.5 V.

14. A circuit as in claim 1 and further including a capacitor coupled between the power line and an output terminal of the trigger circuit.

15. A circuit as in claim 14, wherein the capacitor comprises a p-MOS transistor having a gate terminal, a bulk terminal, a source terminal and a drain terminal, the source terminal, the bulk terminal, and the drain terminal being connected to form a first lead of the capacitor and the gate terminal forming a second lead of the capacitor.

16. A method of electrostatic discharge protection, comprising:

shunting excess charge from a power line to a ground line when a power supply voltage exceeds a preset voltage, the power supply voltage being the voltage between the power line and the ground line.

17. The method of claim 16, wherein shunting excess charge comprises:

producing a trigger signal when the power supply voltage exceeds a cut-off voltage;

conducting current between the power line and the ground line in response to the trigger signal.

18. The method of claim 17, wherein conducting current between the power line and ground line comprises turning on a transistor coupled between the power line and the ground line.

19. The method of claim 17, wherein producing a trigger signal includes turning on a diode array.

* * * * *